United States Patent
Lee et al.

(10) Patent No.: US 9,202,862 B2
(45) Date of Patent: Dec. 1, 2015

(54) SEMICONDUCTOR STRUCTURE AND MANUFACTURING METHOD OF THE SAME

(71) Applicant: Macronix International Co., Ltd., Hsinchu (TW)

(72) Inventors: Ming-Tung Lee, Taoyuan County (TW); Cheng-Chi Lin, Yilan County (TW); Chih-Chia Hsu, Zhongli (TW); Chien-Chung Chen, Pingtung County (TW); Shih-Chin Lien, New Taipei (TW); Shyi-Yuan Wu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/210,528

(22) Filed: Mar. 14, 2014

(65) Prior Publication Data

US 2015/0263085 A1  Sep. 17, 2015

(51) Int. Cl.
*H01L 21/70* (2006.01)
*H01L 29/06* (2006.01)
*H01L 29/78* (2006.01)
*H01L 29/66* (2006.01)

(52) U.S. Cl.
CPC ...... *H01L 29/0615* (2013.01); *H01L 29/66712* (2013.01); *H01L 29/7816* (2013.01)

(58) Field of Classification Search
CPC ............... H01L 29/0615; H01L 29/66712; H01L 29/615
USPC ................. 257/499, 506; 438/424, 439
See application file for complete search history.

(56) References Cited

U.S. PATENT DOCUMENTS

2007/0181948 A1 * 8/2007 Liaw et al. ............. 257/355

* cited by examiner

*Primary Examiner* — Bradley K Smith
(74) *Attorney, Agent, or Firm* — McClure, Qualey & Rodack, LLP (57) ABSTRACT

A semiconductor structure and a manufacturing method of the same are provided. The semiconductor structure includes a substrate, a first well, a first heavily doping region, a field oxide, a first dielectric layer, and a conductive layer. The first well is disposed on the substrate, and the first heavily doping region is disposed in the first well. The field oxide is disposed on the first well and adjacent to the first heavily doping region. The first dielectric layer is disposed on the field oxide and covering the field oxide. The conductive layer is disposed on the first dielectric layer. The first well and the first heavily doping region have a first type doping.

18 Claims, 10 Drawing Sheets

SEMICONDUCTOR STRUCTURE AND MANUFACTURING METHOD OF THE SAME

BACKGROUND

1. Technical Field

The disclosure relates in general to a semiconductor structure and a manufacturing method of the same, and more particularly to a semiconductor structure having high breakdown voltage and a manufacturing method of the same.

2. Description of the Related Art

With the development of semiconductor technology, varied semiconductor elements are invented. For example, memories, transistors and diodes are widely used in electric devices.

In the development of semiconductor technology, researchers try to improve those semiconductor elements, such as reducing the volume, increasing/reducing the turn on voltage, increasing/reducing the breakdown voltage, reducing the electric leakage and solving the ESD issue.

SUMMARY

The present disclosure is directed to a semiconductor structure and a manufacturing method of the same. In the embodiments, the first dielectric layer of the semiconductor structure covers the field oxide, and the conductive layer is disposed on the first dielectric layer as a field plate, which renders the electric field distribution more uniform, and hence the breakdown voltage of the semiconductor structure is further increased.

According to an embodiment of the present disclosure, a semiconductor structure is provided. The semiconductor structure includes a substrate, a first well, a first heavily doping region, a field oxide, a first dielectric layer, and a conductive layer. The first well is disposed on the substrate, and the first heavily doping region is disposed in the first well. The field oxide is disposed on the first well and adjacent to the first heavily doping region. The first dielectric layer is disposed on the field oxide and covering the field oxide. The conductive layer is disposed on the first dielectric layer. The first well and the first heavily doping region have a first type doping.

According to another embodiment of the present disclosure, a semiconductor structure is provided. The semiconductor structure includes a substrate, a first well, two first heavily doping regions, a plurality of field oxides, a plurality of first dielectric layers, a second heavily doping region, and a plurality of conductive layers. The first well is disposed on the substrate. The heavily doping regions are disposed in the first well. The field oxides are disposed on the first well, and the field oxides are adjacent to the first heavily doping regions. The first dielectric layers are disposed on the field oxides and covering the field oxides. The second heavily doping region is disposed in the first well, and the first heavily doping regions are disposed on two sides of the second heavily doping region and separated from each other. The conductive layers are disposed on the first dielectric layers. The first well and the first heavily doping region have a first type doping, and the second heavily doping region has a second type doping complimentary to the first type doping.

According to a further embodiment of the present disclosure, a manufacturing method of a semiconductor structure is provided. The manufacturing method of the semiconductor structure includes the following steps: providing a substrate; forming a first well on the substrate; forming a field oxide on the first well; forming a dielectric material layer covering the field oxide; forming a conductive layer on the dielectric material layer; patterning the dielectric material layer for exposing a region, for forming a first electric layer; and forming a first heavily doping region in the region, wherein the first heavily doping region is adjacent to the field oxide, and a side of the first heavily doping region is aligned with a side of the field oxide; wherein the first well and the first heavily doping region have a first type doping.

The above and other embodiments of the disclosure will become better understood with regard to the following detailed description of the non-limiting embodiment(s). The following description is made with reference to the accompanying drawings.

DETAILED DESCRIPTION

In the embodiments of the present disclosure, a semiconductor structure and a method of manufacturing the same are provided. In the embodiments, the first dielectric layer of the semiconductor structure covers the field oxide, and the conductive layer is disposed on the first dielectric layer as a field plate, which renders the electric field distribution more uniform, and hence the breakdown voltage of the semiconductor structure is further increased. The following embodiments are for the purpose of elaboration only, not for limiting the scope of protection of the invention. Besides, secondary elements are omitted in the following embodiments to highlight the technical features of the invention.

Figure 1A:
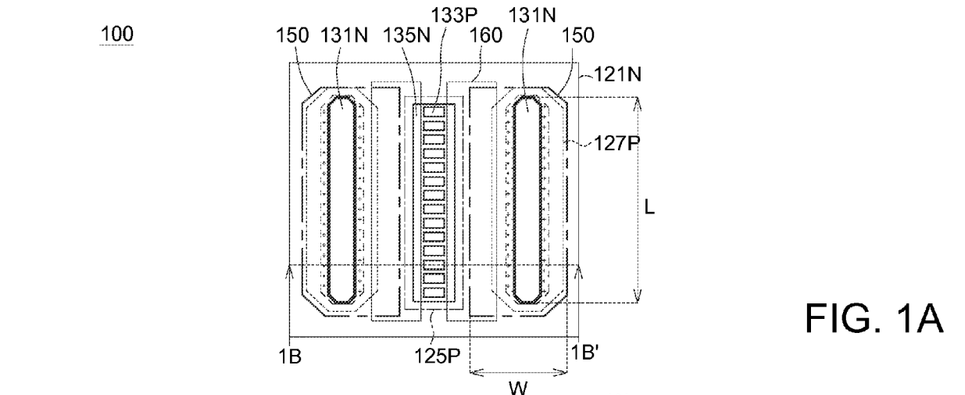
FIG. 1A shows a top view of a semiconductor structure according to an embodiment of the present disclosure.
Figure 1B:
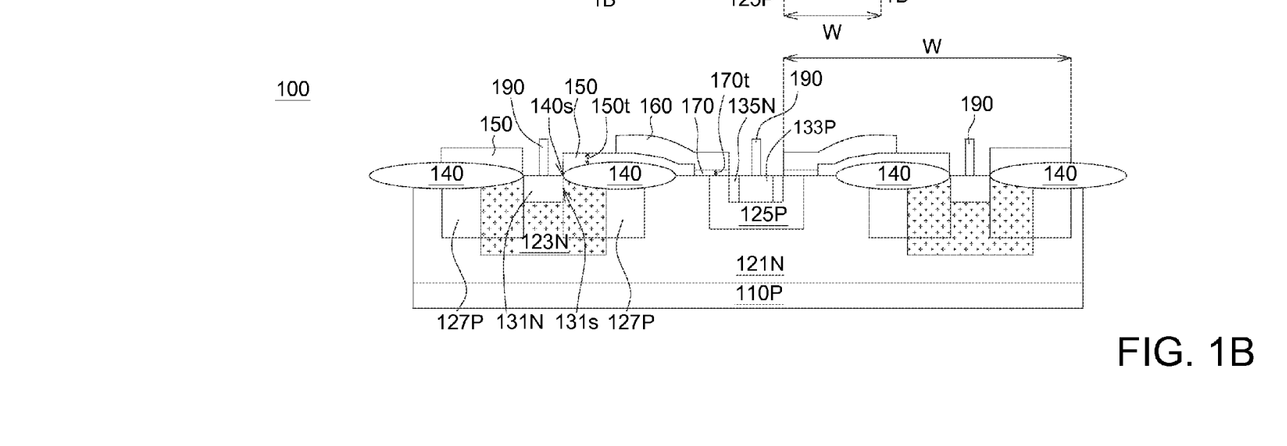
FIG. 1B is a cross-sectional view along the cross-sectional line 1B-1B' in FIG. 1A.

FIG. 1A shows a top view of a semiconductor structure 100 according to an embodiment of the present disclosure, and FIG. 1B is a cross-sectional view along the cross-sectional line 1B-1B' in FIG. 1A. As shown in FIGS. 1A-1B, the semiconductor structure 100 includes a substrate 110P, a first well 121N, a first heavily doping region 131N, a field oxide 140, a first dielectric layer 150, and a conductive layer 160. The first well 121N is disposed on the substrate 110P, and the first heavily doping region 131N is disposed in the first well 121N. The field oxide 140 is disposed on the first well 121N and adjacent to the first heavily doping region 131N. The first dielectric layer 150 is disposed on the field oxide 140 and covering the field oxide 140. The conductive layer 160 is disposed on the first dielectric layer 150. The first well 121N and the first heavily doping region 131N have a first type doping.

In the embodiment, as shown in FIGS. 1A-1B, the first dielectric layer 150 has a width W extending from a side to another side of the first heavily doping region 131N. The first dielectric layer 150 substantially covers the active region of the first heavily doping region 131N, and the first dielectric layer 150 has an opening merely exposing the first heavily doping region 131N. Compared with a dielectric layer covering only one single side of the first heavily doping region 131N, according to the embodiments of the present disclosure, the first dielectric layer 150 has a larger width W, such that the photoresist used for manufacturing the first dielectric layer 150 may have a lower aspect ratio (length-to-width ratio); accordingly, deformation or peeling issues caused by photoresists having high aspect ratios (elongated-shaped photoresist) do not occur easily.

In the embodiment, the material of the substrate 110P is such as P type silicon or N type silicon, the first well 121N is such as a P type well or an N type well, the first heavily doping region 131N is such a P type heavily doping region (P+) or an N type heavily doping region (N+), and the material of the conductive layer 160 is such as polysilicon. In the present embodiment, the first well 121N is such as a light N well, and the first heavily doping region 131N is such as an N type heavily doping region.

In the embodiment, as shown in FIG. 1B, a side 140s of the field oxide 140 is aligned with a side 131s of the first heavily doping region 131N.

In the embodiment, the semiconductor structure 100 may further include a first doping region 123N. As shown in FIG. 1B, the first doping region 123N is disposed in the first well 121N and has the first type doping. The first heavily doping region 131N is disposed in the first doping region 123N.

In the embodiment, the semiconductor structure 100 may further include a second doping region 125P. As shown in FIG. 1B, the second doping region 125P is disposed in the first well 121N, and the second doping region 125P is separated from the first heavily doping region 131N. The second doping region 125P has a second type doping complimentary to the first type doping.

In the embodiment, the semiconductor structure 100 may further include a second dielectric layer 170. As shown in FIG. 1B, the second dielectric layer 170 is disposed between the conductive layer 160 and the second doping region 125P. A thickness 170t of the second dielectric layer 170 is smaller than a thickness 150t of the first dielectric layer 150.

In the embodiment, the semiconductor structure 100 may further include a second heavily doping region 133P. As shown in FIG. 1B, the second heavily doping region 133P is disposed in the second doping region 125P, and the second heavily doping region 133P has the second type doping.

In the embodiment, the semiconductor structure 100 may further include a third heavily doping region 135N. As shown in FIG. 1B, the third heavily doping region 135N is disposed in the second doping region 125P. The third heavily doping region 135N has the first type doping, and the second heavily doping region 133P is disposed in the third heavily doping region 135N.

In the embodiment, the semiconductor structure 100 may further include a second well 127P. As shown in FIG. 1B, the second well 127P is disposed in the first well 121N and surrounding the first heavily doping region 131N. The second well 127P has the second type doping.

In the embodiment, as shown in FIG. 1B, the doping concentration decreases laterally from the first heavily doping region 131N, the overlap region of the first doping region 123N and the second well 127P, the second well 127P, all the way to the first well 121N, and doping concentration of the second doping region 125P is higher than that of the first well 121N. Doping concentrations influence electric field distribution; therefore, the doping concentration of the semiconductor structure 100 increasing from the first well 121N outside the second doping region 125P (drift region) to the first heavily doping region 131N (active region of drain) is advantageous to increasing the breakdown voltage.

In one embodiment, as shown in FIG. 1B, the semiconductor structure 100 may include at least two first heavily doping regions 131N, a plurality of field oxides 140, a plurality of first dielectric layers 150, and a plurality of conductive layers 160. The first heavily doping regions 131N are disposed in the first well 121N, and the at least two first heavily doping regions 131N are disposed on two sides of the second heavily doping region 133P are separated from each other. The field oxides 140 are disposed on the first well 121N, and each of the field oxides 140 is adjacent to at least one of the first heavily doping regions 131N. The first dielectric layers 150 are disposed on the field oxides 140 and covering the field oxides 140. The conductive layers 160 are disposed on the first dielectric layers 150.

In the above-mentioned embodiment, at least two sides 140s of the field oxides 140 are aligned with two sides 131s of one of the first heavily doping regions 131N. For example, as shown in FIG. 1B, the two sides 131s of one of the first heavily doping region 131N are aligned with two sides 140s of two field oxides 140, respectively.

In one embodiment, as shown in FIG. 1B, the semiconductor structure 100 may further include a plurality of second dielectric layers 170. The second dielectric layers 170 are disposed between the conductive layers 160 and the first well 121N, and the thickness of the second dielectric layers 170 is smaller than that of the first dielectric layers 150. In the embodiment, the materials of the first dielectric layers 150 and the second dielectric layers 170 include a dielectric material, such as silicon oxide.

In one embodiment, as shown in FIG. 1B, the semiconductor structure 100 may further include a plurality of contacts 190, which are connected to the first heavily doping region 131N and the second heavily doping region 133P, respectively. In the embodiment, the material of the contacts 190 includes conductive metal, such as tungsten metal.

In one embodiment, as shown in FIGS. 1A-1B, the semiconductor structure 100 may be applied in a lateral diffusion metal oxide semiconductor (LDMOS). The second heavily doping regions 133P are disposed in the third heavily doping region 135N and arranged in a column. The first heavily doping region 131N is such as an N type heavily doping region and electrically connected to a drain, the second heavily doping region 133P is such as a P type heavily doping region and electrically connected to bulk, and the third heavily doping region 135N is such as an N type heavily doping region and electrically connected to a source. The first heavily doping region 131N between two field oxides 140 is such as an active region of drain, the third heavily doping region 135N between two field oxides 140 is such as an active region of source, and the first dielectric layer 150 crosses the active region of drain. When operating the MOS, a high voltage is applied on the drain region having high doping concentration (first heavily doping region 131N), the source region (third heavily doping region 135N) has high doping concentration as well, and the region having lower doping concentration forms the drift region. As shown in FIG. 1B, the second dielectric layer 10 is such as a gate oxide, and a cross-section of the semiconductor structure 100 is provided with two metal oxide semiconductors arranged side by side. The material of the conductive layer 160 is such as polysilicon and can be used as a field plate, which renders the electric field distribution more uniform, and hence the breakdown voltage of the semiconductor structure 100 (LDMOS) is further increased. Moreover, the first dielectric layer 150 covers the field oxide 140, particularly at the region close to the first heavily doping region 131N (drain), and the first dielectric layer 150 having a larger thickness than that of the second dielectric layer 170 may further increase the breakdown voltage.

In one embodiment, the semiconductor structure 100 as shown in FIGS. 1A-1B includes two striped shaped conductive layers 160, forming a LDMOS device having a set of two polysilicon fingers.

Figures 2A, 2B:
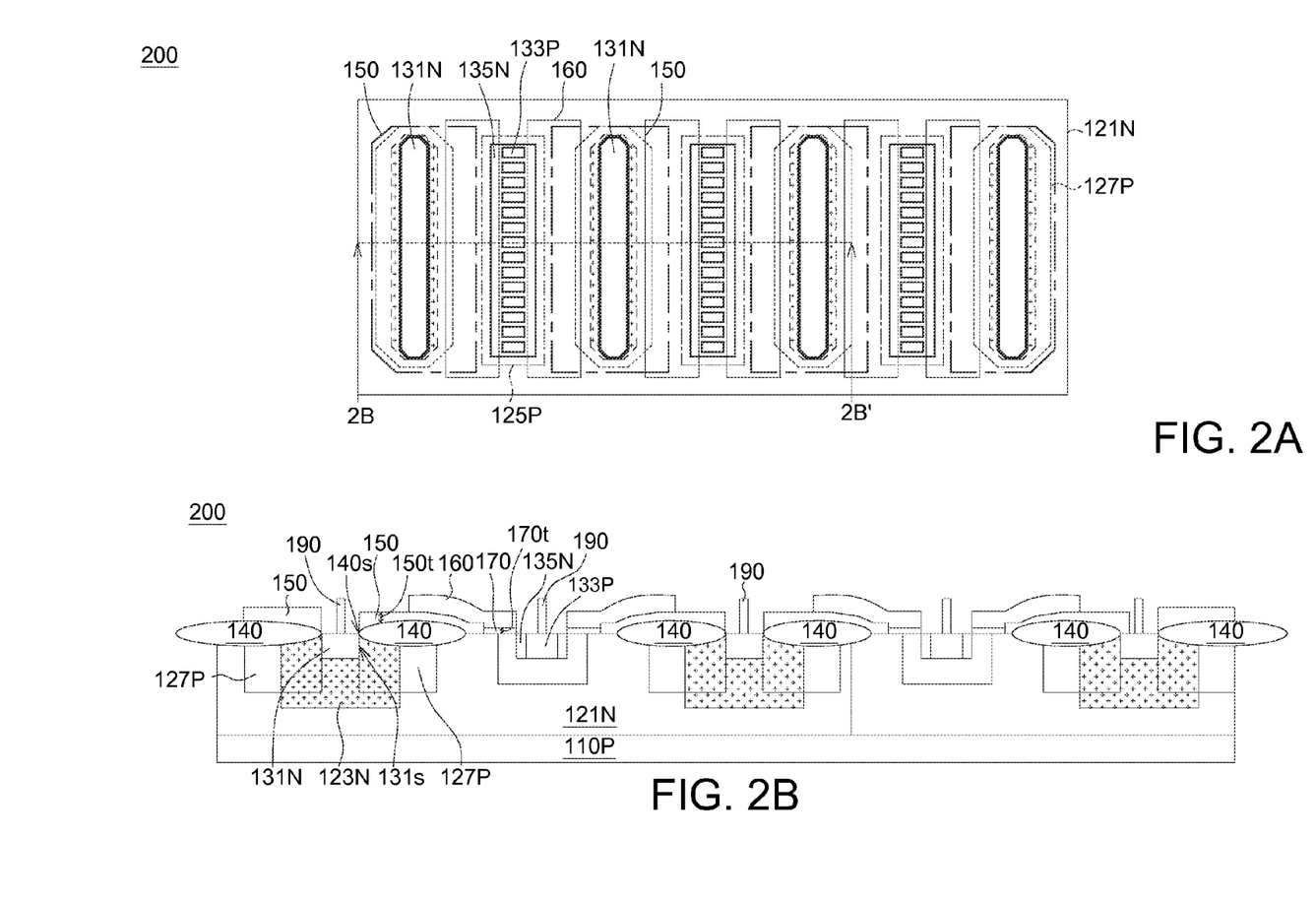
FIG. 2A shows a top view of a semiconductor structure according to another embodiment of the present disclosure.
FIG. 2B is a cross-sectional view along the cross-sectional line 2B-2B' in FIG. 2A.

FIG. 2A shows a top view of a semiconductor structure 200 according to another embodiment of the present disclosure, and FIG. 2B is a cross-sectional view along the cross-sectional line 2B-2B' in FIG. 2A. As shown in FIGS. 2A-2B, the semiconductor structure 200 may include a plurality of columns formed from the second heavily doping regions 133P and a plurality of the first heavily doping regions 131N, the first dielectric layers 150, the conductive layers 160, and the second dielectric layers 170. As shown in FIG. 2B, a cross-section of the semiconductor structure 200 may be provided with a plurality of metal oxide semiconductors arranged in parallel. In the embodiment, the semiconductor structure 200 as shown in FIGS. 2A-2B includes six striped-shaped conductive layers 160, forming a multi-finger LDMOS device having three sets of two polysilicon fingers.

Figure 3A:
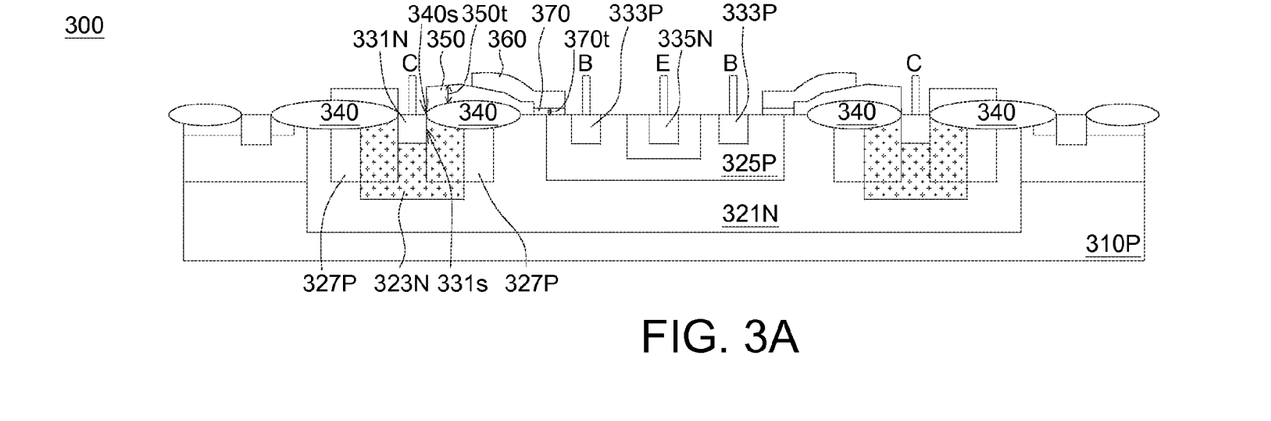
FIG. 3A shows a cross-sectional view of a semiconductor structure according to a further embodiment of the present disclosure.

FIG. 3A shows a cross-sectional view of a semiconductor structure 300 according to a further embodiment of the present disclosure. In the embodiment, the semiconductor structure 300 includes a substrate 310P, a first well 321N, a first heavily doping region 331N, a field oxide 340, a first dielectric layer 350, and a conductive layer 360. The first well 321N is disposed on the substrate 310P, and the first heavily doping region 331N is disposed in the first well 321N. The field oxide 340 is disposed on the first well 321N and adjacent to the first heavily doping region 331N. The first dielectric layer 350 is disposed on the field oxide 340 and covering the field oxide 340. The conductive layer 360 is disposed on the first dielectric layer 350. The first well 321N and the first heavily doping region 331N have a first type doping. In the embodiment, a side 340s of the field oxide 340 is aligned with a side 331s of the first heavily doping region 331N.

In the embodiment, the semiconductor structure 300 may further include a first doping region 323N. As shown in FIG. 3A, the first doping region 323N is disposed in the first well 321N and has the first type doping. The first heavily doping region 331N is disposed in the first doping region 323N.

In the embodiment, the semiconductor structure 300 may further include a second doping region 325P. As shown in FIG. 3A, the second doping region 325P is disposed in the first well 321N, and the second doping region 325P is separated from the first heavily doping region 331N. The second doping region 325P has the second type doping.

In the embodiment, the semiconductor structure 300 may further include a second heavily doping region 333P. As shown in FIG. 3A, the second heavily doping region 333P is disposed in the second doping region 325P, and the second heavily doping region 333P has the second type doping.

In the embodiment, the semiconductor structure 300 may further include a third heavily doping region 335N. As shown in FIG. 3A, the third heavily doping region 335N is disposed in the second doping region 325P. The third heavily doping region 335N has the first type doping.

In the embodiment, the semiconductor structure 300 may further include a second well 327P. As shown in FIG. 3A, the second well 327P is disposed in the first well 321N and surrounding the first heavily doping region 331N. The second well 327P has the second type doping.

In the embodiment, the semiconductor structure 300 may further include a second dielectric layer 370. As shown in FIG. 3A, the second dielectric layer 370 is disposed between the conductive layer 360 and the second doping region 325P. A thickness 370t of the second dielectric layer 370 is smaller than a thickness 350t of the first dielectric layer 350.

In the present embodiment, the first type doping is such as an N type doping, and the second type doping is such as a P type doping. The semiconductor structure 300 may be applied in an N-P-N BJT. The first heavily doping region 331N is such as an N type heavily doping region and electrically connected to collector C, the second heavily doping region 333P is such as a P type heavily doping region and electrically connected to base B, and the third heavily doping region 335N is such as an N type heavily doping region and electrically connected to emitter E. The material of the conductive layer 360 is such as polysilicon and can be used as a field plate, which renders the electric field distribution more uniform, and hence the breakdown voltage of the semiconductor structure 300 is further increased. Moreover, the first dielectric layer 350 covers the field oxide 340, particularly at the region close to the first heavily doping region 331N (collector), and hence the breakdown voltage may be further increased.

Figure 3B:
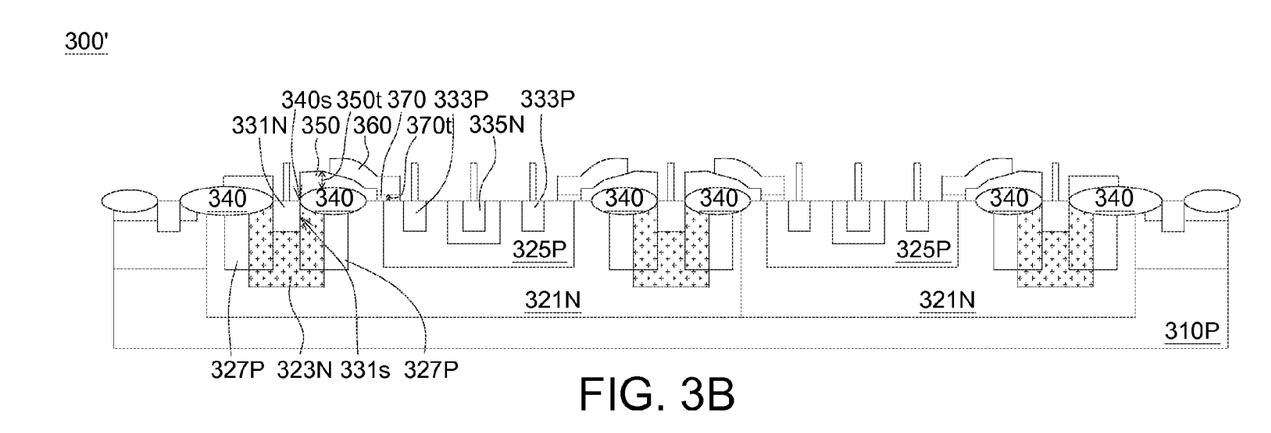
FIG. 3B shows a cross-sectional view of a semiconductor structure according to a still further embodiment of the present disclosure.

FIG. 3B shows a cross-sectional view of a semiconductor structure 300' according to a still further embodiment of the present disclosure. As shown in FIG. 3B, the semiconductor structure 300' may further include a plurality of the semiconductor structures 300 formed from the first heavily doping regions 331N, the second heavily doping regions 333P, the third heavily doping regions 335N, the first dielectric layers 350, and the conductive layers 360. As shown in FIG. 3B, a cross-section of the semiconductor structure 300' may be provided with a plurality of N-P-N BJT's arranged in parallel.

Figure 4:
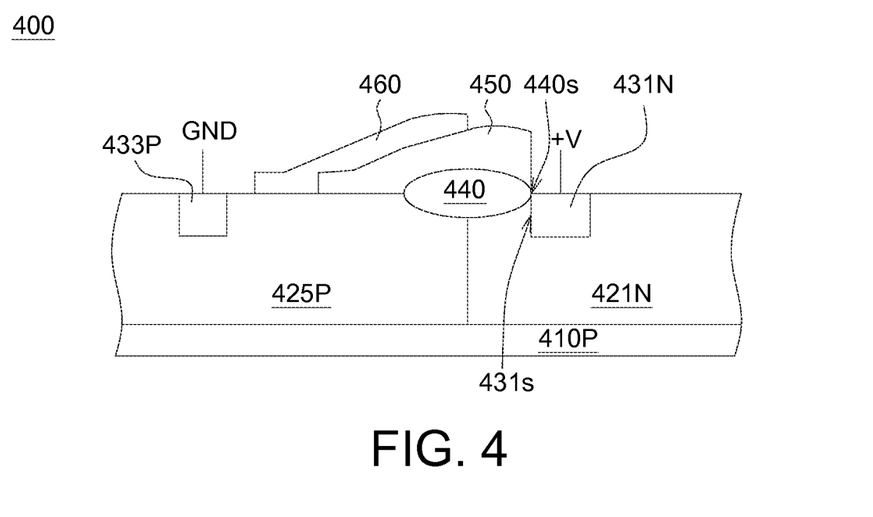
FIG. 4 shows a cross-sectional view of a semiconductor structure according to a still another embodiment of the present disclosure.

FIG. 4 shows a cross-sectional view of a semiconductor structure 400 according to a still another embodiment of the present disclosure. In the embodiment, the semiconductor structure 400 includes a substrate 410P, a first well 421N, a first heavily doping region 431N, a field oxide 440, a first dielectric layer 450, and a conductive layer 460. The first well 421N is disposed on the substrate 410P, and the first heavily doping region 431N is disposed in the first well 421N. The field oxide 440 is disposed on the first well 421N and adjacent to the first heavily doping region 431N. The first dielectric layer 450 is disposed on the field oxide 440 and covering the field oxide 440. The conductive layer 460 is disposed on the first dielectric layer 450. The first well 421N and the first heavily doping region 431N have a first type doping. In the embodiment, as shown in FIG. 4, a side 440s of the field oxide 440 is aligned with a side 431s of the first heavily doping region 431N.

In the embodiment, the semiconductor structure 400 may further include a doping region 425P. As shown in FIG. 4, the doping region 425P is disposed on the substrate 410P and adjacent to the first well 421N. The doping region 425P is separated from the first heavily doping region 431N. The doping region 425P has the second type doping.

In the embodiment, the semiconductor structure 400 may further include a second heavily doping region 433P. As shown in FIG. 4, the second heavily doping region 433P is disposed in the doping region 425P, and the second heavily doping region 433P has the second type doping.

In the present embodiment, the first type doping is such as an N type doping, and the second type doping is such as a P type doping. The semiconductor structure 400 may be applied in a diode. The first heavily doping region 431N is such as an N type heavily doping region and electrically connected to a positive voltage, and the second heavily doping region 433P is such as a P type heavily doping region and is grounded. The material of the conductive layer 460 is such as polysilicon and can be used as a field plate, which renders the electric field distribution more uniform, and hence the breakdown voltage of the semiconductor structure 400 is further increased. However, the conductive layer 460 is not applied with any working voltage. Moreover, the first dielectric layer 450 covers the field oxide 440, particularly at the region close to the first heavily doping region 431N, and hence the breakdown voltage may be further increased. In another embodiment, a plurality of semiconductor structures 400 may be arranged in parallel to form a diode device with diodes arranged side by side.

Figure 5:
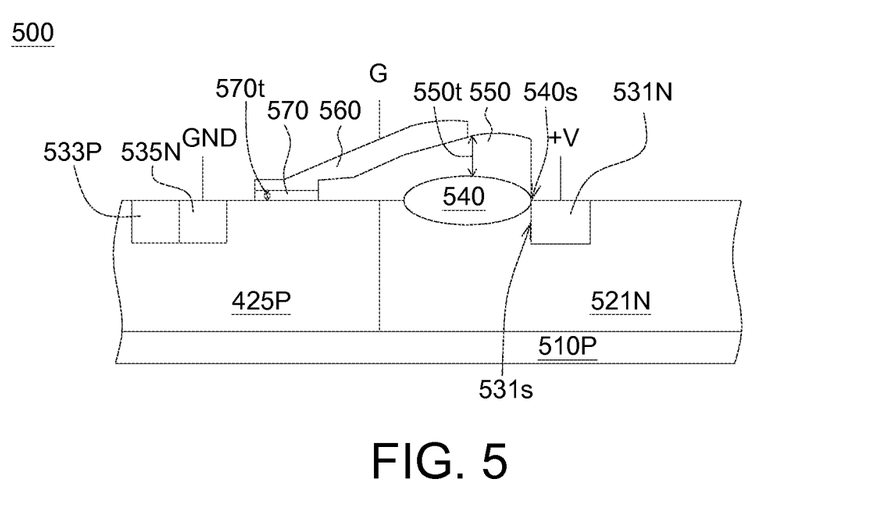
FIG. 5 shows a cross-sectional view of a semiconductor structure according to yet another embodiment of the present disclosure.

FIG. 5 shows a cross-sectional view of a semiconductor structure 500 according to yet another embodiment of the present disclosure. In the embodiment, the semiconductor structure 500 includes a substrate 510P, a first well 521N, a first heavily doping region 531N, a field oxide 540, a first dielectric layer 550, and a conductive layer 560. The first well 521N is disposed on the substrate 510P, and the first heavily doping region 531N is disposed in the first well 521N. The field oxide 540 is disposed on the first well 521N and adjacent to the first heavily doping region 531N. The first dielectric layer 550 is disposed on the field oxide 540 and covering the field oxide 540. The conductive layer 560 is disposed on the first dielectric layer 550. The first well 521N and the first heavily doping region 531N have a first type doping. In the embodiment, as shown in FIG. 5, a side 540s of the field oxide 540 is aligned with a side 531s of the first heavily doping region 531N.

In the embodiment, the semiconductor structure 500 may further include a doping region 525P. As shown in FIG. 5, the doping region 525P is disposed on the substrate 510P and adjacent to the first well 521N. The doping region 525P is separated from the first heavily doping region 531N. The doping region 525P has the second type doping.

In the embodiment, the semiconductor structure 500 may further include a second heavily doping region 533P. As shown in FIG. 5, the second heavily doping region 533P is disposed in the doping region 525P, and the second heavily doping region 533P has the second type doping.

In the embodiment, the semiconductor structure 500 may further include a third heavily doping region 535N. As shown in FIG. 5, the third heavily doping region 535N is disposed in the doping region 525P and adjacent to the second heavily doping region 533P. The third heavily doping region 535N has the first type doping.

In the embodiment, the semiconductor structure 500 may further include a second dielectric layer 570. As shown in FIG. 5, the second dielectric layer 570 is disposed between the conductive layer 560 and the doping region 525P. A thickness 570t of the second dielectric layer 570 is smaller than a thickness 550t of the first dielectric layer 550.

In the present embodiment, the first type doping is such as an N type doping, and the second type doping is such as a P type doping. The semiconductor structure 500 may be applied in an extended drain metal oxide semiconductor (EDMOS). The first heavily doping region 531N is such as an N type heavily doping region and electrically connected to a drain, and the third heavily doping region 535N is such as an N type heavily doping region and is grounded. The material of the conductive layer 560 is such as polysilicon and can be used as a gate for applying working voltage thereon. Moreover, the conductive layer 560 can also be used as a field plate, which renders the electric field distribution more uniform, and hence the breakdown voltage of the semiconductor structure 500 is further increased. Moreover, the first dielectric layer 550 covers the field oxide 540, particularly at the region close to the first heavily doping region 531N (drain), and hence the breakdown voltage may be further increased.

Referring to FIG. 1B and FIGS. 6A-6F, a manufacturing method of the semiconductor structure 100 according to an embodiment of the disclosure is illustrated.

Figure 6A:
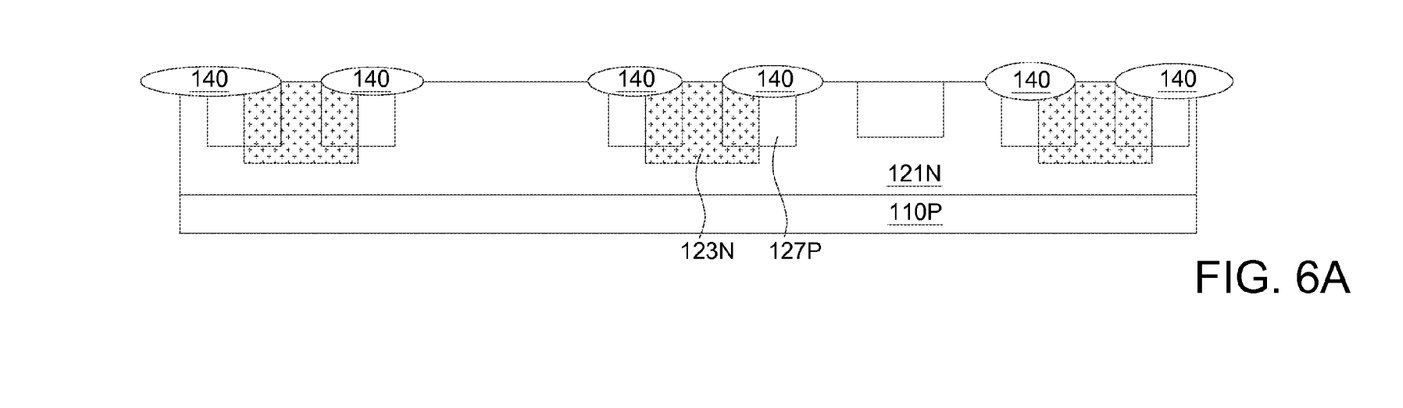
FIGS. 6A-6F illustrate a manufacturing method of the semiconductor structure according to an embodiment of the disclosure.

First, as shown in FIG. 6A, the substrate 110P is provided, the first well 121N is formed on the substrate 110P, and the field oxide 140 is formed on the first well 121N. The first well 121N has the first type doping.

As shown in FIG. 6A, the first doping region 123N and the second well 127P may be further formed in the first well 121N, wherein the first doping region 123N has the first type doping, and the second well 127P has the second type doping. In the embodiment, as shown in FIG. 6A, a partial region of the first doping region 123N and a partial region of the second well 127P overlap.

Figure 6B:
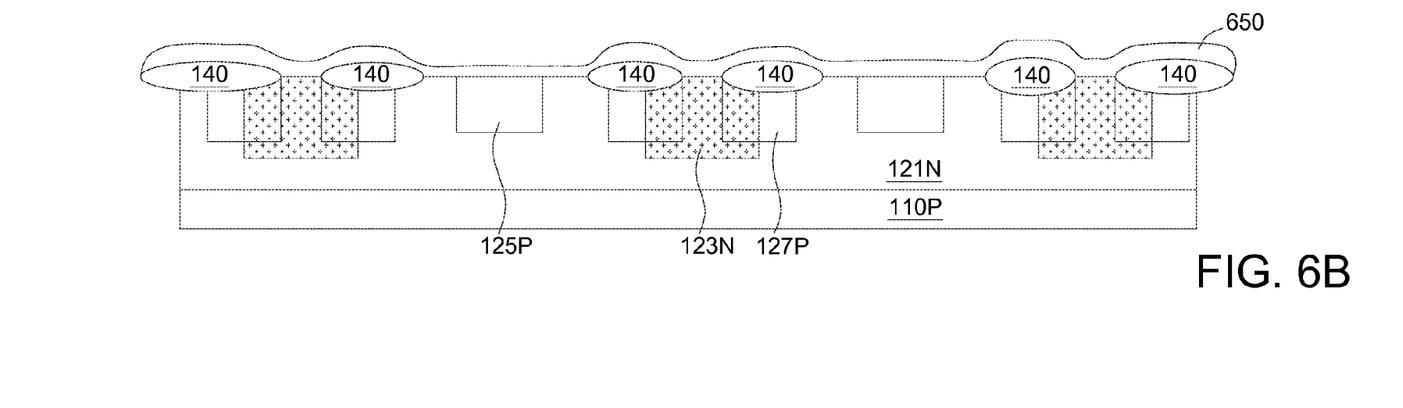

As shown in FIG. 6B, a dielectric material layer 650 is formed for covering the field oxide 140. In the embodiment, the dielectric material layer 650 covers the surface of the whole structure. In other words, the dielectric material layer 650 covers the first well 121N and the first doping region 123N.

As shown in FIG. 6B, the second doping region 125P may be optionally formed in the first well 121N. The second doping region 125P having the second type doping is separated from the first doping region 123N. In an alternative embodiment, the second doping region 125P may not be formed in the present step. In the embodiments, the second doping region 125P may be formed by photoresist etching, exposure, development, and implantation processes.

Figure 6C:
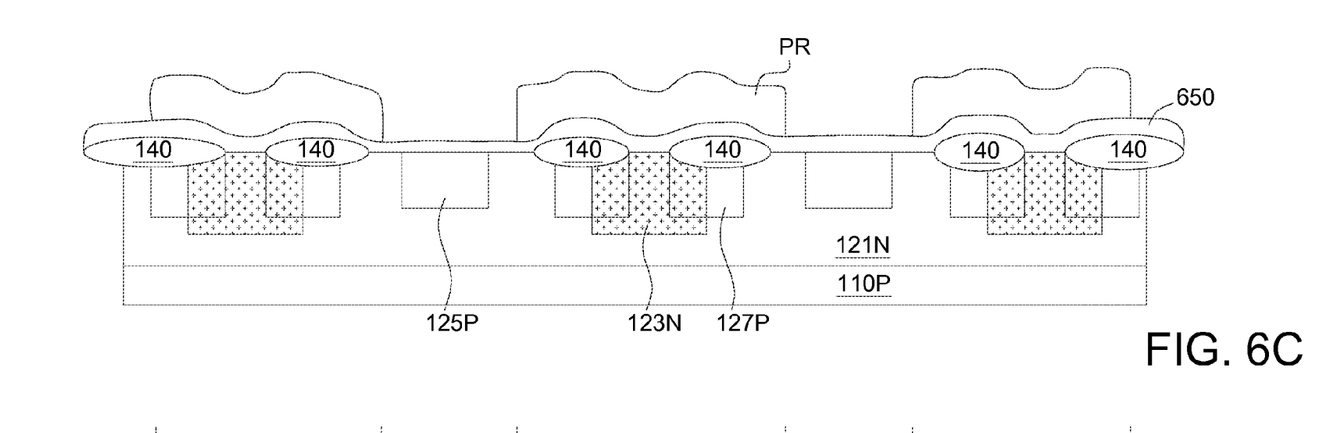
Figure 6D:
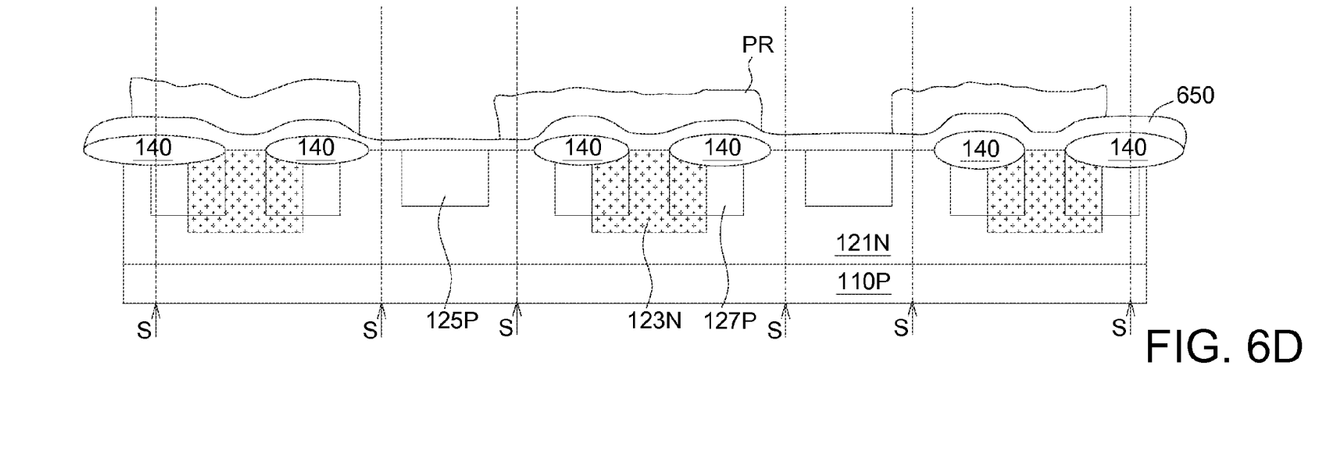
Figure 6E:
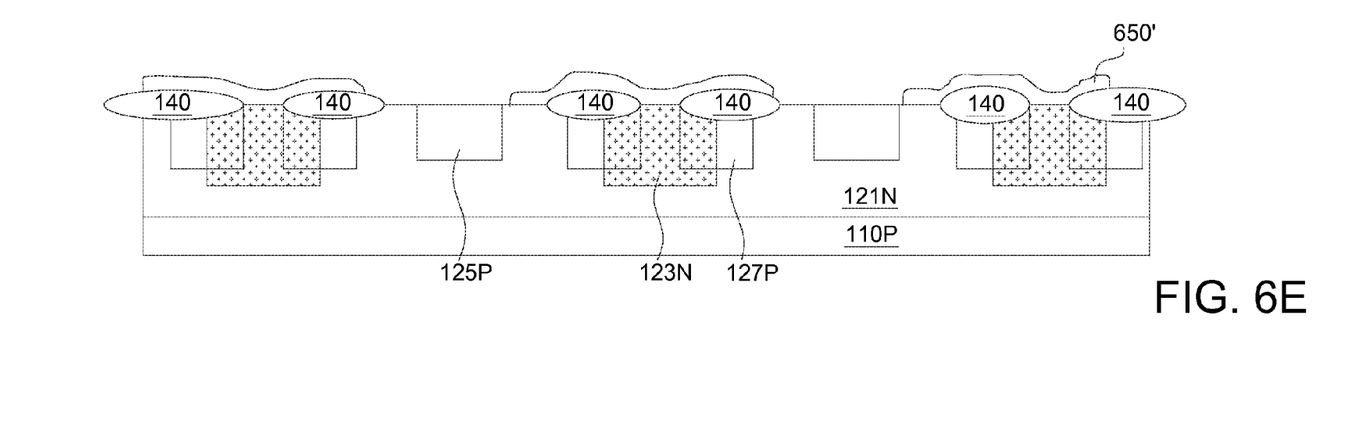

As shown in FIGS. 6C-6E a portion of the dielectric material layer 650 is removed for exposing a region corresponding to the second doping region 125P. In the present embodiment, the second doping region 125P has been formed in the first well 121N in the present step, and the second doping region 125P is exposed after the portion of the dielectric material layer 650 is removed. In an alternative embodiment, the second doping region 125P is not yet formed in the first well 121N in the present step, and a region where the second doping region 125P is predetermined to be formed therein is exposed after the portion of the dielectric material layer 650 is removed. In other words, in the present step, a portion of the dielectric material layer 650 is removed for exposing a region corresponding to the second doping region 125P, and the first well 121N as well as the first doping region 123N is still covered by the dielectric material layer 650. In one embodiment, the second doping region 125P corresponds to an active region of drain of a semiconductor device.

Specifically speaking, as shown in FIG. 6, a patterned photoresist PR is formed on the dielectric material layer 650. The patterned photoresist PR exposes a portion of the dielectric material layer 650 which is predetermined to be removed. In the embodiment, the patterned photoresist PR is formed by such as photoresist exposure and development processes.

Next, in some cases, a displacement of the patterned photoresist PR may occur in the manufacturing process. As shown in FIG. 6D, the lines S indicate the initial boundaries of the patterned photoresist PR as formed, and the patterned photoresist PR may be shifted, resulting in misalignment with the boundaries (lines S). In some embodiments, the displacement of the patterned photoresist PR may occur more easily when a plurality of sets of MOS's are formed simultaneously.

Next, as shown in FIG. 6E, the patterned photoresist PR is removed, and a patterned dielectric material layer 650' is thus formed. Currently, the dielectric material layer 650' fully covers the active region corresponding to the first heavily doping region 131N (e.g. active region of drain) and partially covers the active region corresponding to the second doping region 125P (e.g. active region of source). In other words, in the embodiment, the region where the first heavily doping region 131N is supposed to be formed is not exposed in the present step, as such, the uniformity of the thickness of the first dielectric layer located on two sides of the first heavily doping region 131N may be maintained even if a displacement of the patterned photoresist PR occurs in the present step. Accordingly, the influence of the displacement of the patterned photoresist PR on the breakdown voltage can be further decreased, and such effect is particularly remarkable when plurality sets of MOS's are formed simultaneously.

Figure 6F:
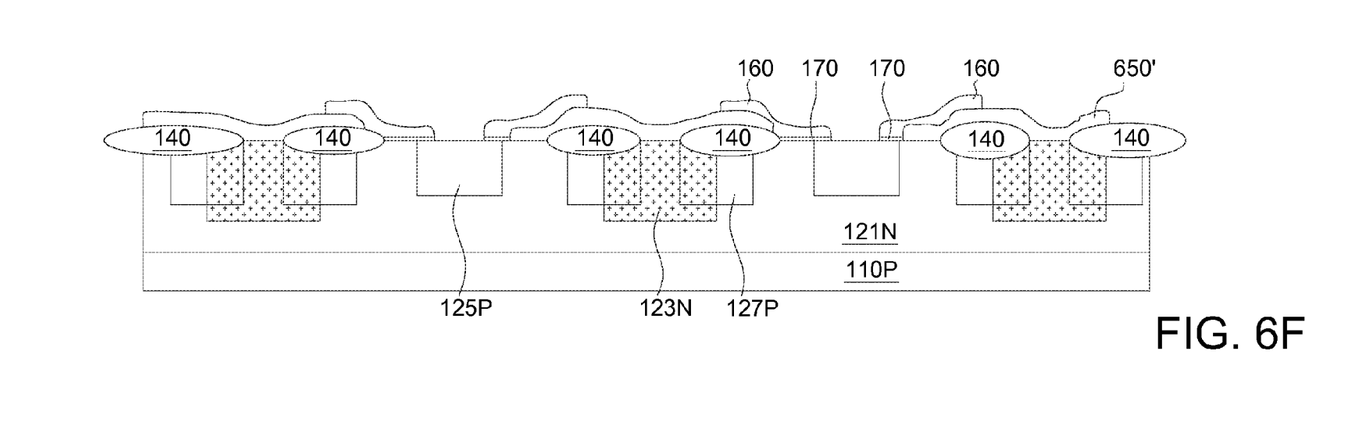

As shown in FIG. 6F, the conductive layer 160 is formed on the dielectric material layer 650'. As shown in FIG. 6F, the second dielectric layer 170 may be formed between the conductive layer 160 and the second doping region 125P as well. It is to be noted that, in the present step, the dielectric material layer 650' still fully covers the active region corresponding to the first heavily doping region 131N. In the embodiment, the manufacturing method of the conductive layer 160 includes, such as, forming a full planar conductive material layer, performing photoresist exposure and development processes for defining the range of the conductive layer 160, etching the conductive material layer, and removing the photoresist.

In an alternative embodiment, the second doping region 125P is not yet formed in the first well 121N. Thus, in the present step, the second dielectric layer 170 is formed between the conductive layer 160 and the region where the second doping region 125P is supposed to be formed. And then, the second doping region 125P is formed in the first well 121N, and the second dielectric layer 170 is located between the conductive layer 160 and the second doping region 125P.

Next, referring to FIG. 1B, the dielectric material layer 650' is patterned for exposing a region, for forming the first dielectric layer 150, and the first heavily doping region 131 is formed in the exposed region. In other words, the step of patterning the dielectric material layer 650 is for exposing the region the first heavily doping region 131N is predetermined to be formed therein. In one embodiment, in the step of patterning the dielectric material layer 650', only the region where the first heavily doping region 131N is supposed to be formed is exposed. The first heavily doping region 131N is formed in the first doping region 123N and adjacent to the field oxide 140, and a side 131s of the first heavily doping region 131N is aligned with a side 140s of the field oxide 140. The first heavily doping region 131N having the first type doping is separated form the second doping region 125P. In the embodiment, a thickness 170t of the second dielectric layer 170 is smaller than a thickness 150t of the first dielectric layer 150.

In the embodiment, the to-be-exposed region is defined by photoresist exposure, etching, and development processes, a reactive ion etching (RIE) process is then performed to expose the predetermined region, and then the photoresist is removed.

Next, still referring to FIG. 1B, implantation processes are performed on the regions where the first heavily doping region 131N, the second heavily doping region 133P, and the third heavily doping region 135N are predetermined to be formed, for forming the above-mentioned heavily doping regions. Next, an interlayer dielectric layer is deposited, and contacts 190 are formed in the interlay dielectric layer. As such, the semiconductor structure 100 as shown in FIGS. 1A-1B is formed.

According to the embodiments of the present disclosure, patterning the dielectric material layer 650' for exposing the region where the first heavily doping region 131N is supposed to be formed is performed after the formation of the conductive layer 160. In other words, the conductive layer 160 is formed on the dielectric material layer 650', such that the thickness of the dielectric material layer 650' under the conductive layer 160 may be well maintained, particularly at the region close to the active region of the first heavily doping region 131N, without influenced by other manufacturing processes. After that, the dielectric material layer 650' is patterned to define the active region of the first heavily doping region 131N. As such, the first dielectric layer 150 having uniform thickness can be formed for assuring a higher breakdown voltage is achieved. Moreover, the first dielectric layer 150 has substantially the same thickness on two sides of the first heavily doping region 131N, such uniform thickness rendering a more uniform electric field distribution, which is advantageous to maintaining high breakdown voltage.

In addition, according to known manufacturing methods, the active regions of drain and source are defined in one single photoresist/etching process. In contrast, according to the embodiments of the present disclosure, the step of removing a portion of the dielectric material layer 650 for exposing a region corresponding to the second doping region 125P is performed after the formation of the conductive layer 160, followed by the patterning of the dielectric material layer 650' for exposing a region where the first heavily doping region 131N is supposed to be formed. That is, according to the embodiments of the present disclosure, the active region of source (second doping region 125P) and the active region of drain (first heavily doping region 131N) are defined separately in two steps.

Figure 7:
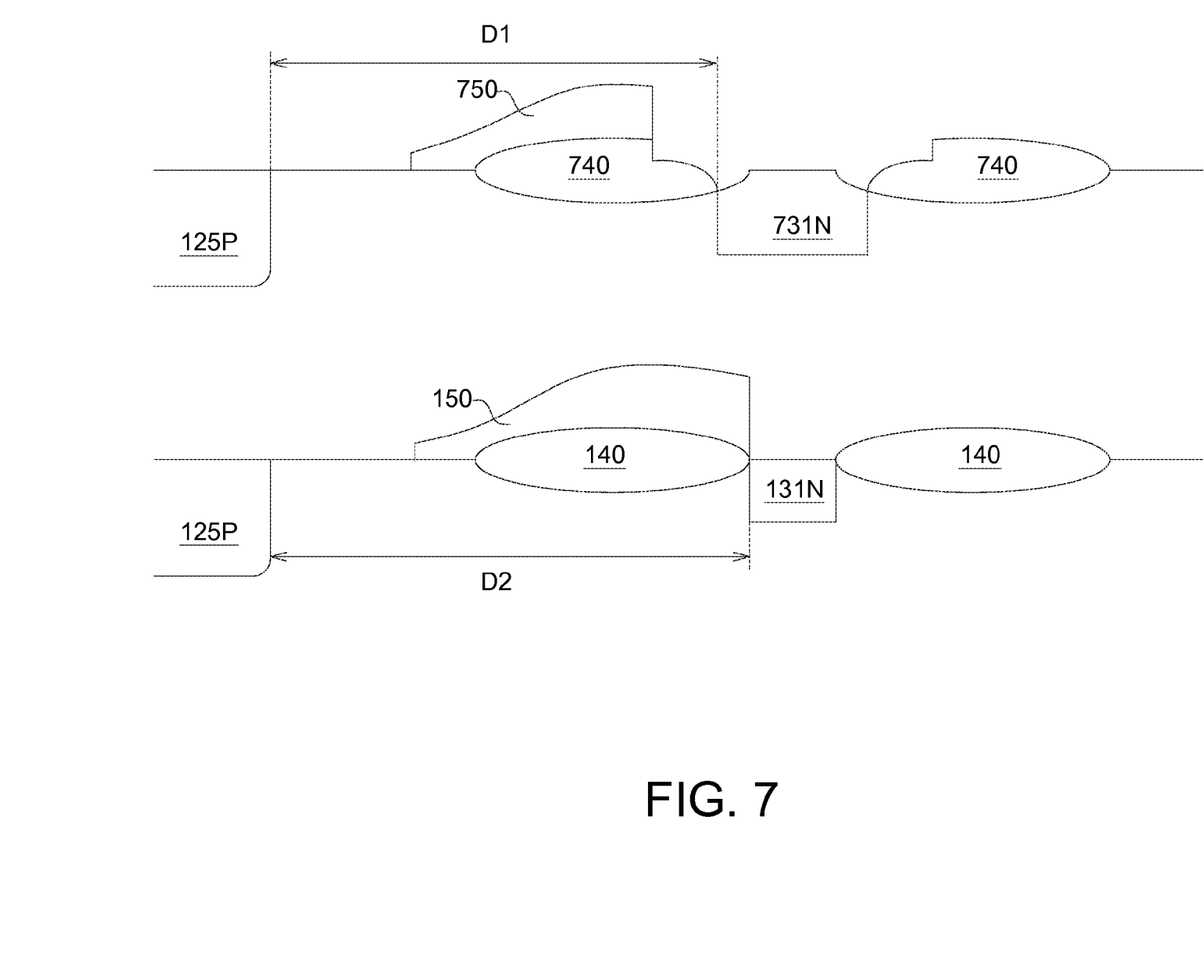
FIG. 7 shows schematic diagrams of formations of field oxides and first heavily doping regions according to a comparative embodiment and an embodiment of the present disclosure.

Referring to FIG. 7, schematic diagrams of formations of field oxides and first heavily doping regions according to a comparative embodiment and an embodiment of the present disclosure are shown. As shown in FIG. 7, conventionally, in order to make sure that the dielectric material layer is etched completely to define the range of the dielectric layer 750, the field oxide 740 is usually over-etched, such that the field oxide 740 has a relatively smaller thickness at the region close to the etched opening. Moreover, while an implantation process is performed through the etched opening of the dielectric layer 750 for forming the heavily doping region 731N, the range of a photoresist is provided with a necessary tolerance, and thus the edge of the field oxide 740 is exposed from the photoresist. As such, the thinned portion of the field oxide 740 close to the etched opening, which is not covered by the photoresist, may cause the implantation range (N+ or P+) to diffuse out of the originally predetermined range, resulting in the formation of the heavily doping region 731N having a width larger than a predetermined width. In such case, when a positive voltage is applied on the heavily doping region 731N, and the doping region 125P is applied by ground or a negative voltage, a depletion region extending to the boundary of the heavily doping region and having a length D1 is formed. However, according to the embodiments of the present disclosure, the dielectric material layer 650' is patterned for only exposing the region where the first heavily doping region 131N is predetermined to be formed, therefore, over-etching of the field oxide 140 does not occur. Accordingly, the range of the first heavily doping region 131N formed by performing an implantation process is more concentrated and does not expand, and the side 150s of the first dielectric layer 150 is substantially aligned with the side 131s of the first heavily doping region 131N. In the embodiment, the as-formed depletion region has a length D2 and has a larger range, therefore, the semiconductor structure of the embodiments may have high breakdown voltage compared to those make by conventional methods.

Furthermore, as the field oxide 740 is over-etched, the field oxide 740 would have a relatively small thickness at the region close to the etched opening, and such thickness has a poor uniformity since it is formed by over-etching. Nevertheless, concentration and uniformity of an implantation process are influenced by the thickness of the oxide located above the implantation region, therefore, the field oxide 740 having non-uniform thickness cause non-uniformity of concentration of the implantation to the heavily doping region 731N. In contrast, according to the embodiments of the present disclosure, the dielectric material layer 650' is patterned for only exposing the region where the first heavily doping region 131N is predetermined to be formed, and thus the field oxide 140 is not over-etched; therefore, the problems of non-uniformity of implantation concentration of the first heavily doping region 131N caused by non-uniformity of thickness of oxide layers can be prevented.

Further illustration is provided with the following embodiments. The manufacturing conditions and measured data are shown below. However, the following embodiments are for the purpose of elaboration only, not for limiting the scope of protection of the invention.

Figure 8:
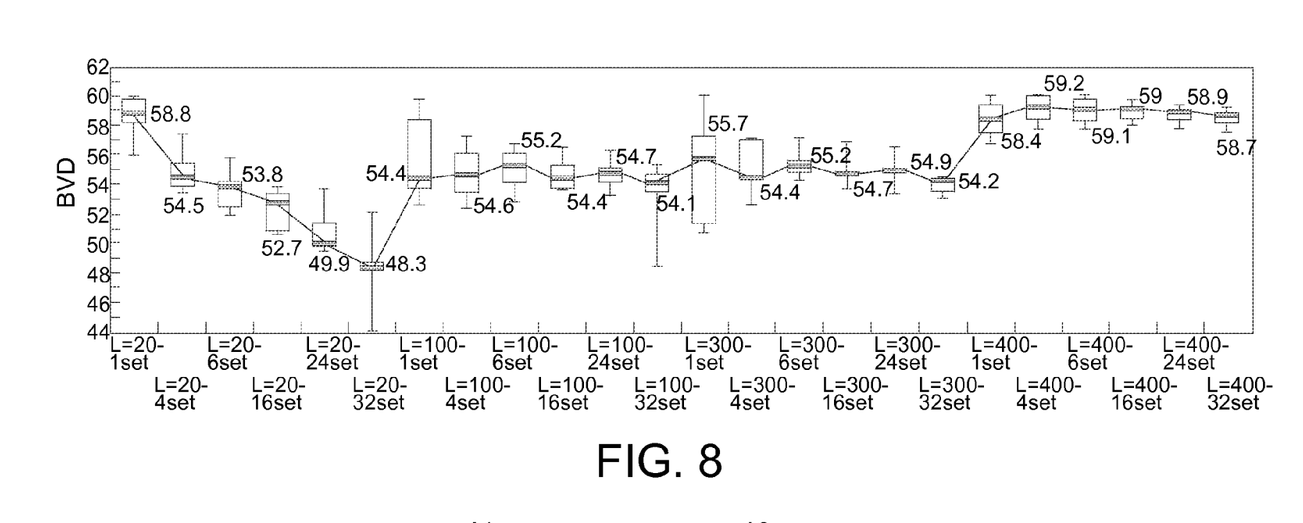
FIG. 8 shows the relationship between the breakdown voltages and the structure arrangements of embodiments and comparative embodiments.

FIG. 8 shows the relationship between the breakdown voltages and the structure arrangements of embodiments and comparative embodiments. Referring to FIG. 1A, the "L" as shown in FIG. 8 represents the length of the first heavily doping region 131N (active region of drain), and every two finger-shaped conductive layers 160 construct a set of metal oxide semiconductors. In FIG. 8, the breakdown voltages with lengths L of 20-300 µm are measured from semiconductor structures manufactured by conventional methods, wherein the active regions of drain and source are defined in one single photoresist etching process; and the breakdown voltages with lengths L of 400 µm are measured from semiconductor structures manufactured according to the embodiments of the present disclosure. The widths of the first heavily doping regions 131N (active region of drain) of embodiments and comparative embodiments are all about 1.1 µm. Five measurements are made for each of the structures in FIG. 8, and the numbers shown in FIG. 8 are the medium numbers of every five measured values.

Generally speaking, when the number of sets of the conductive layers 160 increases, or when the length of the first heavily doping regions 131N (active region of drain) is longer, the displacement of the patterned photoresist PR along the width W direction and the influence thereof are more serious, and the uniformity of the thickness of the dielectric layer (e.g. first dielectric layer and/or field oxide) on two sides of the first heavily doping region 131N (active region of drain) is worse, which is disadvantageous to maintaining high breakdown voltage. As shown in FIG. 8, for the semiconductor structures manufactured according to the embodiments of the present disclosure, the measured breakdown voltages are all at least higher than 58.4 V, even with the first heavily doping regions 131N having lengths L of 400 µm. In contrast, the measured breakdown voltages of semiconductor structures of comparative embodiments are mostly below 58.4 V, except that the one with a length L of 20 µm and a set number of 1 may have a measured breakdown voltage of higher than 58.4 V. In other words, according to the embodiments of the present disclosure, very high breakdown voltages can be maintained even while the active regions of drain have very long lengths. On the contrary, even with less sets and shorter lengths L, the breakdown voltages of the semiconductor structures manufactured by conventional methods are still mostly lower than those of the semiconductor structures manufactured according to the embodiments of the present disclosure.

Figure 9:
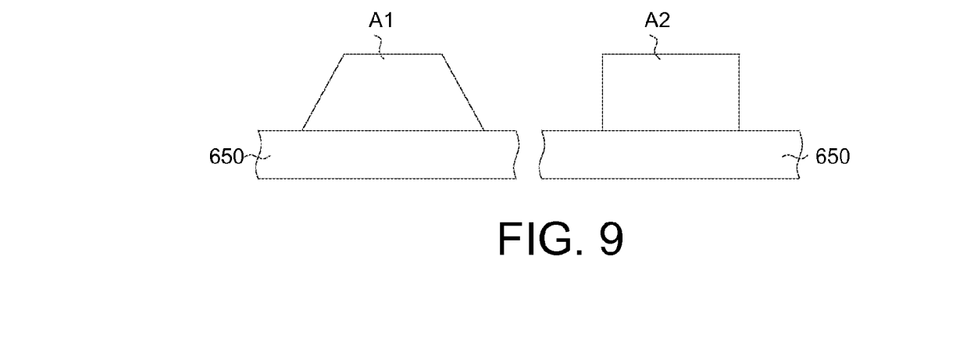
FIG. 9 shows structures of patterned photoresists used to manufacture semiconductor structures of embodiments and comparative embodiments.

FIG. 9 shows structures of patterned photoresists used to manufacture semiconductor structures of embodiments and comparative embodiments. As shown in FIG. 9, the photoresist A1 has inclined side surfaces, while the photoresist A2 has vertical side surfaces. In other words, the photoresist A2 has a better resolution than that of the photoresist A1. The semiconductor structures of embodiments and comparative embodiments of FIG. 8 are all manufactured by using the photoresist A1.

Figure 10:
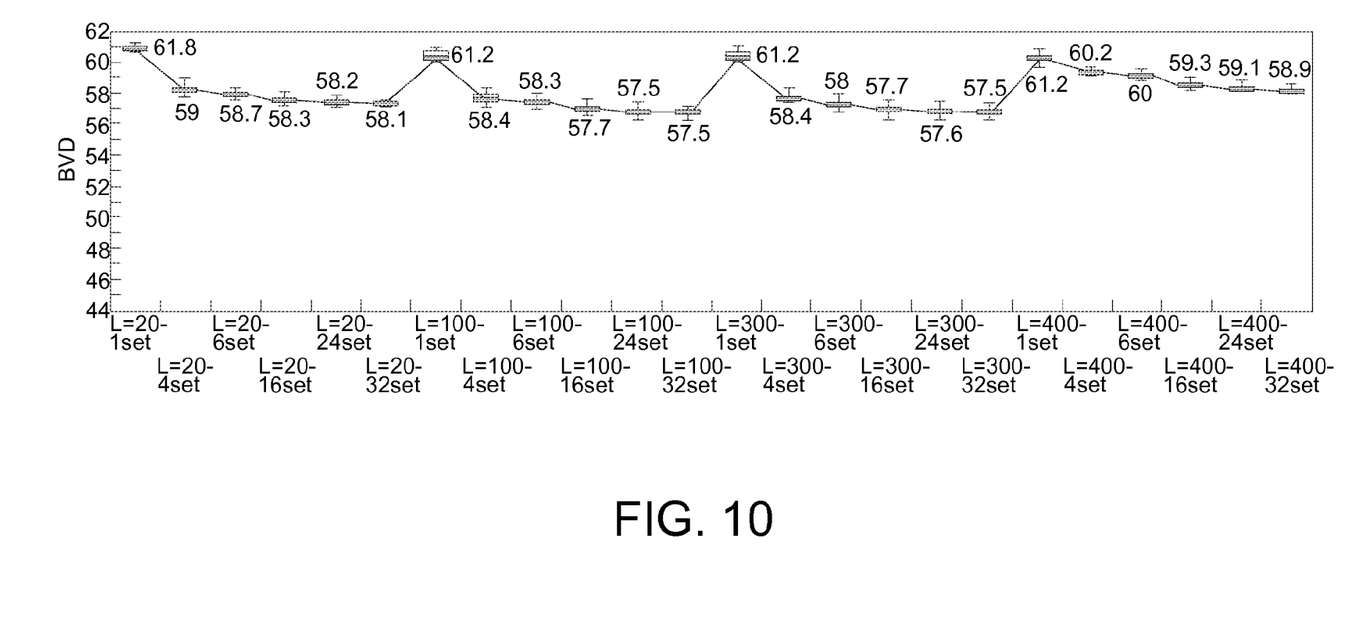
FIG. 10 shows the relationship between the breakdown voltages and the structure arrangements of embodiments and comparative embodiments using the photoresist A2.

FIG. 10 shows the relationship between the breakdown voltages and the structure arrangements of embodiments and comparative embodiments using the photoresist A2. As shown in FIG. 10, when the photoresist A2 with a better resolution is used, the breakdown voltages are generally improved, and the breakdown voltages decrease less and slower as the number of sets of the conductive layers increases. In other words, the adverse influence of the increasing number of sets of conductive layers on the breakdown voltages can be improved to a certain level. However, these data does not directly reflect the influence of the displacement of the patterned photoresist on the breakdown voltage of a semiconductor structure.

Tables 1-3 below show the manufacturing conditions and the measured data of the semiconductor structures of embodiments and comparative embodiments. Tables 1-2 show comparative embodiments, which refer to the semiconductor structures manufactured by conventional methods, wherein active regions of drain and source are defined in one single photoresist exposure and etching process. Table 3 shows embodiments, which refer to the semiconductor structures manufactured according to the embodiments of the present disclosure. Table 1 shows the measured data from structures having the first heavily doping regions 131N (active region of drain) with lengths L of 20 µm and numbers of sets of conductive layers of 1 and 32. Table 2 shows the measured data from structures having the first heavily doping regions 131N (active region of drain) with lengths L of 3000 µm and numbers of sets of conductive layers of 1 and 32. Table 3 shows the measured data from structures having the first heavily doping regions 131N (active region of drain) with lengths L of 400 µm and numbers of sets of conductive layers of 1 and 32. In the Tables, exposure energy (mJ) indicates the exposure energy applied on the photoresist, the width (μm) indicates the measured width of the photoresist on the first dielectric layer 150 after exposure, and the photoresist displacement (μm) indicates the displacement distance of the photoresist along the width direction of the first heavily doping region 131N. Tables 1-3 show measured data while varying the photoresist displacement values. However, the following embodiments are for the purpose of elaboration only, not for limiting the scope of protection of the invention.

TABLE 1

| | Exposure energy (mJ) | | | | | |
|---|---|---|---|---|---|---|
| | 350 | 330 | 310 | 290 | 270 | 250 |
| Width (μm) | 1.791 | 1.811 | 1.840 | 1.866 | 1.896 | 1.916 |

Length L = 20 μm, number of sets of conductive layers = 1

| Photoresist displacement (μm) | Breakdown voltage (V) | | | | | |
|---|---|---|---|---|---|---|
| 0.230 | N/A | 50.9 | 52.4 | 53.5 | 38.7 | N/A |
| 0.207 | 53.0 | 54.0 | 54.6 | 55 | 56.6 | 57.8 |
| 0.182 | 54.0 | 53.8 | 55.3 | 54.8 | 56.6 | 57.8 |
| 0.157 | 55.9 | 55.6 | 57.2 | 56.6 | 57.6 | 59.3 |
| 0.123 | 57.0 | 57.1 | 57.4 | 57.9 | 58.3 | 59.1 |
| 0.079 | N/A | 59.9 | 59.6 | 59.5 | 59.4 | N/A |
| 0.030 | N/A | N/A | 61.1 | 60.3 | N/A | N/A |

Length L = 20 μm, number of sets of conductive layers = 32

| Photoresist displacement (μm) | Breakdown voltage (V) | | | | | |
|---|---|---|---|---|---|---|
| 0.230 | N/A | 50 | 51.8 | 53.8 | 100 | N/A |
| 0.207 | 52.5 | 53.6 | 54.4 | 49.9 | 56.8 | 57.1 |
| 0.182 | 53.9 | 51.6 | 50.3 | 46.5 | 57 | 58.3 |
| 0.157 | 53.2 | 47.4 | 47.9 | 47.6 | 50.9 | 58.3 |
| 0.123 | 57.4 | 53.9 | 52.4 | 48.5 | 46.3 | 59.2 |
| 0.079 | N/A | 58.4 | 58.3 | 53.2 | 50.1 | N/A |
| 0.030 | N/A | N/A | 58.2 | 59.2 | N/A | N/A |

TABLE 2

| | Exposure energy (mJ) | | | | | |
|---|---|---|---|---|---|---|
| | 350 | 330 | 310 | 290 | 270 | 250 |
| Width (μm) | 1.791 | 1.811 | 1.840 | 1.866 | 1.896 | 1.916 |

Length L = 300 μm, number of sets of conductive layers = 1

| Photoresist displacement (μm) | Breakdown voltage (V) | | | | | |
|---|---|---|---|---|---|---|
| 0.230 | N/A | 48.6 | 50.2 | 51.4 | 54 | N/A |
| 0.207 | 51.1 | 52. | 52.8 | 53 | 55.6 | 56.9 |
| 0.182 | 52.5 | 52.1 | 52.8 | 53.7 | 55.4 | 57 |
| 0.157 | 54.8 | 54.4 | 55.9 | 55.6 | 56.6 | 58.3 |
| 0.123 | 56.1 | 56.1 | 56.8 | 54.6 | 52.1 | 58.4 |
| 0.079 | N/A | 59.4 | 59.2 | 58.8 | 58.5 | N/A |
| 0.030 | N/A | N/A | 60.5 | 60 | N/A | N/A |

Length L = 300 μm, number of sets of conductive layers = 32

| Photoresist displacement (μm) | Breakdown voltage (V) | | | | | |
|---|---|---|---|---|---|---|
| 0.230 | N/A | 48.9 | 50.4 | 52.5 | 100 | N/A |
| 0.207 | 51.4 | 52.3 | 49.1 | 41.9 | 55.7 | 51.1 |
| 0.182 | 52.7 | 44.4 | 43.8 | 41.8 | 55.7 | 57.3 |

TABLE 2-continued

| | Exposure energy (mJ) | | | | | |
|---|---|---|---|---|---|---|
| | 350 | 330 | 310 | 290 | 270 | 250 |
| 0.157 | 46.1 | 42.3 | 42.7 | 42.4 | 43.5 | 58.3 |
| 0.123 | 53.7 | 46.5 | 44.6 | 41.7 | 39.8 | 58.6 |
| 0.079 | N/A | 58 | 57.9 | 44.2 | 40.1 | N/A |
| 0.030 | N/A | N/A | 57.8 | 58.6 | N/A | N/A |

TABLE 3

| | Exposure energy (mJ) | | | | | |
|---|---|---|---|---|---|---|
| | 350 | 330 | 310 | 290 | 270 | 250 |
| Width (μm) | 1.791 | 1.811 | 1.840 | 1.866 | 1.896 | 1.916 |

Length L = 400 μm, number of sets of conductive layers = 1

| Photoresist displacement (μm) | Breakdown voltage (V) | | | | | |
|---|---|---|---|---|---|---|
| 0.230 | N/A | 48.6 | 50.4 | 51.3 | 53.2 | N/A |
| 0.207 | 50.9 | 51.7 | 52.6 | 52.8 | 54.6 | 56.7 |
| 0.182 | 52.1 | 52.2 | 53.3 | 53.6 | 54.8 | 56.1 |
| 0.157 | 54.4 | 54.3 | 55.7 | 55.4 | 55.9 | 57.3 |
| 0.123 | 55.9 | 55.9 | 56.7 | 56.8 | 56.9 | 57.5 |
| 0.079 | N/A | 58.9 | 58.8 | 58.3 | 57.4 | N/A |
| 0.030 | N/A | N/A | 60 | 59.6 | N/A | N/A |

Length L = 400 μm, number of sets of conductive layers = 32

| Photoresist displacement (μm) | Breakdown voltage (V) | | | | | |
|---|---|---|---|---|---|---|
| 0.230 | N/A | 48.8 | 50.6 | 5.2 | 100 | N/A |
| 0.207 | 51.4 | 52 | 52.7 | 53.6 | 54.6 | 55.1 |
| 0.182 | 52.3 | 52.1 | 53.6 | 53.8 | 55 | 56.7 |
| 0.157 | 54.6 | 54.5 | 56 | 55.2 | 56.2 | 57.5 |
| 0.123 | 56.2 | 56.4 | 57.1 | 57.4 | 57.2 | 58.1 |
| 0.079 | N/A | 59.2 | 59.1 | 58.8 | 58.4 | N/A |
| 0.030 | N/A | N/A | 59.4 | 59.6 | N/A | N/A |

While the lowest acceptable breakdown voltage is set at, for example, 50 V, the breakdown voltages of comparative embodiments with set number of 1 as shown in Tables 1-2 may achieve 50 V or higher. However, while the number of sets increases up to 32, the tolerance of the photoresist displacements of comparative embodiments as shown in Table 1 is required to be lower than 0.079 μm, and the tolerance of the photoresist displacements of comparative embodiments as shown in Table 2 is required to be even lower than 0.030 μm, in order to achieve the breakdown voltage of 50 V. In other words, despite that the photoresist A2 having good resolution is used to define active regions of drain and source in one single step, the manufacturing tolerance of photoresist displacement is still very low.

On the contrary, referring to Table 3, while the lengths L of the first heavily doping regions 131N (active region of drain) are all higher than the lengths L as shown in Tables 1-2, the breakdown voltages as shown in Table 3 can all achieve 50 V or higher, either with the number of set is 1, or the number of sets is 32, wherein the manufacturing tolerance of photoresist displacement is below 0.207 μm. In other words, compared to the semiconductor structures manufactured by conventional methods and only using the photoresist A2 having good resolution, the semiconductor structures manufactured according to the embodiments of the present disclosure can not only have higher breakdown voltage but also have higher manufacturing tolerance of displacement distance.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a substrate;
   a first well disposed on the substrate;
   a first heavily doping region disposed in the first well;
   a field oxide disposed on the first well and adjacent to the first heavily doping region;
   a first dielectric layer disposed on the field oxide and covering the field oxide; and
   a conductive layer disposed on the first dielectric layer, wherein the first well and the first heavily doping region have a first type doping;
   a second doping region disposed in the first well, the second doping region being separated from the first heavily doping region, wherein the second doping region has a second type doping complimentary to the first type doping; and
   a second dielectric layer disposed between the conductive layer and the second doping region, wherein a thickness of the second dielectric layer is smaller than a thickness of the first dielectric layer.

2. The semiconductor structure according to claim 1, wherein a side of the field oxide is aligned with a side of the first heavily doping region.

3. The semiconductor structure according to claim 1, further comprising:
   a first doping region having the first type doping disposed in the first well, wherein the first heavily doping region is disposed in the first doping region.

4. The semiconductor structure according to claim 1, further comprising:
   a second heavily doping region disposed in the second doping region, wherein the second heavily doping region has the second type doping.

5. The semiconductor structure according to claim 4, further comprising:
   a third heavily doping region disposed in the second doping region, wherein the third heavily doping region has the first type doping, and the second heavily doping region is disposed in the third heavily doping region.

6. The semiconductor structure according to claim 1, further comprising:
   a second well disposed in the first well and surrounding the first heavily doping region, wherein the second well has a second type doping complimentary to the first type doping.

7. A semiconductor structure, comprising:
   a substrate;
   a first well disposed on the substrate;
   two first heavily doping regions disposed in the first well;
   a plurality of field oxides disposed on the first well, the field oxides being adjacent to the first heavily doping regions;
   a plurality of first dielectric layers disposed on the field oxides and covering the field oxides;
   a second heavily doping region disposed in the first well, the first heavily doping regions being disposed on two sides of the second heavily doping region and separated from each other; and
   a plurality of conductive layers disposed on the first dielectric layers;
   wherein the first well and the first heavily doping region have a first type doping, and the second heavily doping region has a second type doping complimentary to the first type doping.

8. The semiconductor structure according to claim 7, wherein at least two sides of the field oxides are aligned with two sides of one of the first heavily doping regions.

9. The semiconductor structure according to claim 7, further comprising:
   a first doping region having the first type doping disposed in the first well, wherein one of the first heavily doping regions is disposed in the first doping region; and
   a second doping region having the second type doping disposed in the first well, wherein the second doping region is located separated from the first doping region.

10. The semiconductor structure according to claim 9, further comprising:
    a plurality of second dielectric layers disposed between the conductive layer and the second doping region, wherein a thickness of the second dielectric layers is smaller than a thickness of the first dielectric layers.

11. The semiconductor structure according to claim 9, further comprising:
    a third heavily doping region disposed in the second doping region, wherein the third heavily doping region has the first type doping, and the second heavily doping region is disposed in the third heavily doping region; and
    a second well disposed in the first well and surrounding one of the first heavily doping regions, wherein the second well has the second type doping.

12. The semiconductor structure according to claim 7, further comprising:
    a plurality of contacts connected to the first heavily doping regions and the second heavily doping region, respectively.

13. A manufacturing method of a semiconductor structure, comprising:
    providing a substrate;
    forming a first well on the substrate;
    forming a field oxide on the first well;
    forming a dielectric material layer covering the field oxide;
    forming a conductive layer on the dielectric material layer;
    patterning the dielectric material layer for exposing a region, for forming a first electric layer; and
    forming a first heavily doping region in the region, wherein the first heavily doping region is adjacent to the field oxide, and a side of the first heavily doping region is aligned with a side of the field oxide;
    wherein the first well and the first heavily doping region have a first type doping.

14. The manufacturing method of the semiconductor structure according to claim 13, wherein patterning the dielectric material layer for exposing the region is performed after forming the conductive layer.

15. The manufacturing method of the semiconductor structure according to claim 13, further comprising:
    forming a first doping in the first well, wherein the first doping region has the first type doping, and the first heavily doping region is formed in the first doping region.

16. The manufacturing method of the semiconductor structure according to claim 13, further comprising:
    forming a second doping region in the first well, wherein the second doping region is separated from the first heavily doping region, and the second doping region has a second type doping complimentary to the first type doping.

17. The manufacturing method of the semiconductor structure according to claim 16, further comprising:
   forming a second dielectric layer between the conductive layer and the second doping region, wherein a thickness of the second dielectric layer is smaller than a thickness of the first dielectric layer.

18. The manufacturing method of the semiconductor structure according to claim 16, prior to forming the conductive layer, further comprising:
   removing a portion of the dielectric material layer for exposing a region corresponding to the second doping region.

* * * * *